United States Patent
Debley et al.

[11] Patent Number: 5,529,671
[45] Date of Patent: Jun. 25, 1996

[54] APPARATUS AND METHOD FOR ION BEAM POLISHING AND FOR IN-SITU ELLIPSOMETRIC DEPOSITION OF ION BEAM FILMS

[75] Inventors: William P. Debley, North Hills; John G. Larson, Tarzana, both of Calif.

[73] Assignee: Litton Systems, Inc., Woodland Hills, Calif.

[21] Appl. No.: 282,098
[22] Filed: Jul. 27, 1994
[51] Int. Cl.⁶ ................................................... C23C 14/34
[52] U.S. Cl. ............................ 204/192.34; 204/192.11; 204/298.04; 204/298.36
[58] Field of Search ..................... 204/192.11, 192.34, 204/298.04, 298.36; 356/139.1, 152.2

[56] References Cited

U.S. PATENT DOCUMENTS

| | | | |
|---|---|---|---|
| 4,142,958 | 3/1979 | Wei et al. | 204/192 P |
| 4,419,202 | 12/1983 | Harper et al. | 204/192 R |
| 4,481,062 | 11/1984 | Kaufman et al. | 156/345 |
| 4,684,848 | 8/1987 | Kaufman et al. | 315/111.81 |
| 4,793,908 | 12/1988 | Scott et al. | 204/192.26 |
| 4,816,133 | 3/1989 | Barnett | 204/298 |

*Primary Examiner*—Nam Nguyen
*Attorney, Agent, or Firm*—Wilfred G. Caldwell; James F. Kirk; Chester E. Martine

[57] ABSTRACT

The invention uses an ion beam to polish a rotatable substrate from an oblique angle between the horizontal and the center line of the gun to the substrate to upgrade the quality of substrates. Alternatively, the substrates are left in the high vacuum chamber without breaking the vacuum for in-situ deposition of thin films thereby avoiding contamination, and to provide premium optics. A wobble stick arrangement is provided to align the ellipsometer reflected beam with the ellipsometer detector during operation without breaking the vacuum which, if broken, would admit contamination.

26 Claims, 5 Drawing Sheets

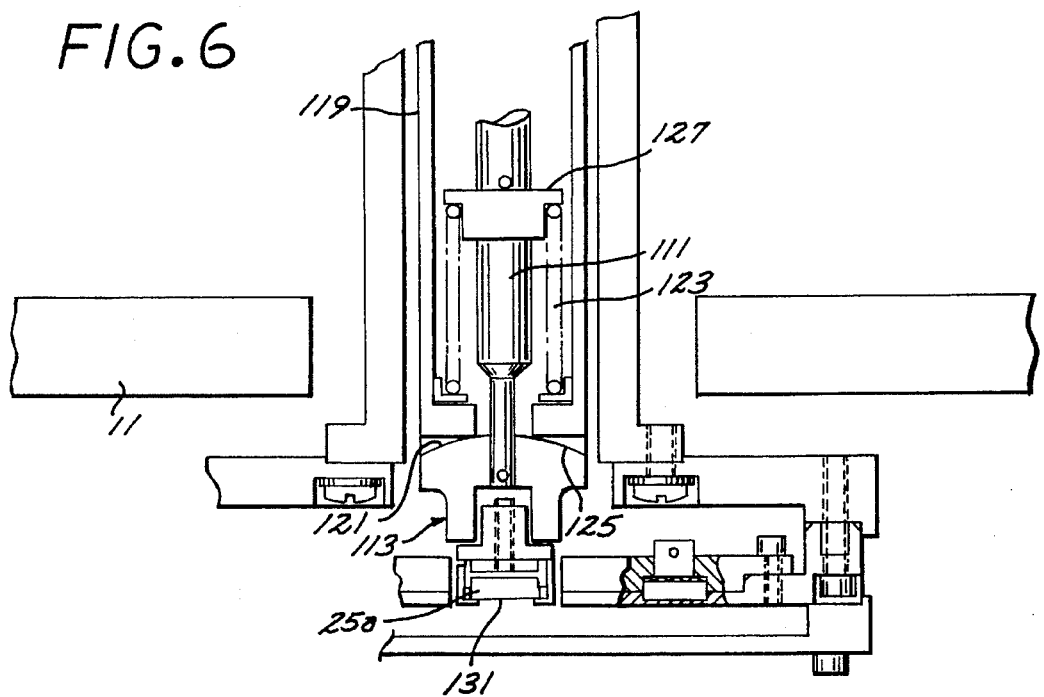
FIG. 6
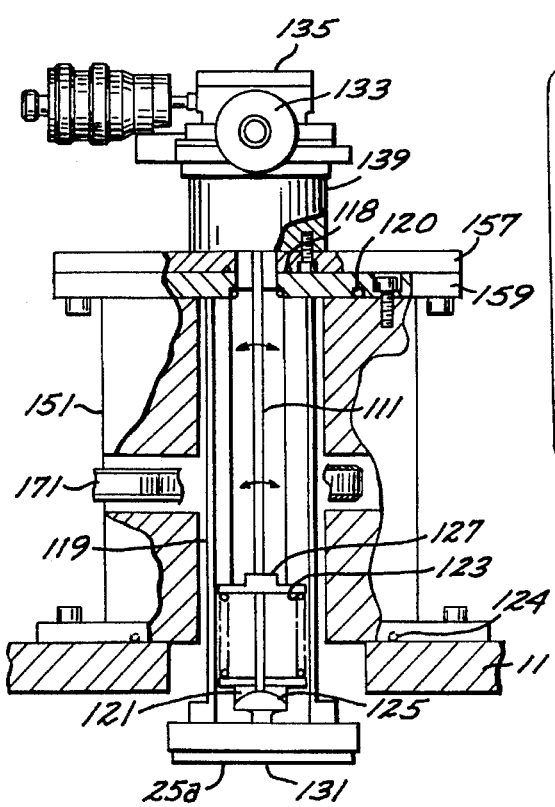
FIG. 7
FIG. 8

APPARATUS AND METHOD FOR ION BEAM POLISHING AND FOR IN-SITU ELLIPSOMETRIC DEPOSITION OF ION BEAM FILMS

BACKGROUND OF THE INVENTION

1. Field of the Invention

The making of super mirrors or other premium optical elements by exaggerated ion beam polishing and by in-situ polishing and deposition of ion beam films onto a substrate of glass, ceramic, metal or plastic with out breaking the vacuum.

2. Related Art

Conventional cleaning of optical substrates preparatory to coating is principally confined to removing dirt and oil from the substrate surface to be film coated because in the optical field, it is believed that removing substrate material degrades the substrate film receiving surface. Ion beams directed at the substrate from a right angle can indeed, degrade the surface. The use of too much power (i.e.) current and/or voltage also will result in damage to the substrate surface as does the use of ion beams on stationary substrates.

No related-prior art is known wherein the beam polishing is carried beyond the mere surface cleaning of a substrate, nor wherein such a super smoothed substrate is immediately optical film coated in-situ to achieve vastly improved optical qualities including anti-reflective coatings and highly reflective mirror coatings.

SUMMARY OF THE INVENTION

Conventional highly polished substrates are placed in an ultra high vacuum chamber on tooling that rotates the substrate at approximately 36 RPM. An ion beam gun (in this case 3 cm) is effective in the chamber at a predetermined distance from the tooling (approximately 20 cm), and at an oblique angle of approximately 45 to 60 degrees between the horizontal and the beam centerline to the substrate surface. The ion beam gun in the chamber uniformly bombards the rotating substrate surface for an extended time to more than effect cleaning. The gun power is enhanced to e.g. 25 to 50 Ma at 600–950 volts dc (from 10 mA at 400 volts) and as much as 200 angstroms or more is removed from the substrate surface to ensure flatness for building a foundation for premium optics, i.e.. within ½ to ¾ angstroms flatness. This eliminates, not only microscopic scratches, pits, tips, digs and scuffs, but also sleeks.

The extent of polishing is measured using a Dektak profilometer for material removal and a Zygo interferometer is used to measure the flatness in angstroms of a given area measured in millimeters squared (angstroms/millimeter squared). The substrates (or other parts) are conventionally pre-polished outside the chamber to better than two angstroms flatness for the whole surface area before the part is loaded into the chamber.

The time interval for maintaining the polishing ion beam is determined empirically. The ablation rate is known for each material of interest for a predetermined ion beam current. So it is possible to look up the time required to final polish the part based on the depth of the surface flatness determined optically from pre-polished parts before they are placed in the chamber. A Zygo interferometer is used to measure the surface flatness. Touching the surface of the part is potentially destructive and adds contaminants to the surface being measured. The part that is used for the measurement may therefore not be used.

To insure that the parts are as contaminant free as possible, i.e. direct from the polishing machine, samples are selected for the lot measurement to be performed and if samples are acceptable, as to quality, then the remainder of the batch are assumed to be acceptable, and they are visually inspected under a dark field microscope for scratches and pits and a laser microscope is used for bulk scatter, using illumination from a helium neon laser. This is done before the parts are loaded into the tooling, and the tooling is then installed in the chamber, then the chamber is closed.

The parts are final polished within the closed chamber for a time determined from the measurements of the polished parts prior to chamber closure. Since sleeks may be as deep as 100 to 1000 angstroms, it is frequently necessary to remove several thousand angstroms of material from the substrate surface and maintain a ½ to ¾ angstrom flatness.

The further improved optical surfaces are maintained by immediately film coating the prepared substrate in-situ without breaking the vacuum of the coating chamber. This of coarse requires target material, and substrates within the chamber and a second ion gun for target deposition. The oblique angle preferred in the described polishing is in the range of 45–60 degrees but the selected angle can be adjusted by observing final products of the same type.

Planetary gearing is used for additional variation of the rotation patterns and rates of the different substrates to improve the uniformity of the coatings. Additional optical quality enhancements are be achieved by altering the polishing oblique angle as a function of the incident light to lens angle in the intended application of the optics to be formed from the substrates.

Another way of interpreting the meaning of premium optics, as used herein for anti reflecting elements is to compare the performance of premium optics to mirrors used in the prisms found within conventional binocular optics which usually absorb approximately 50,000 PPM of light incident on a mirror surface. The premium optics that this invention is concerned with, such as the mirrors for reflecting laser light within a gyro cavity, might typically be expected to have an absorption in the range of 50–100 PPM. The mirrors produced by this invention process more typically absorb less than 50 parts of light incident on the mirror surface per million parts of light reflected by the surface of the mirror.

The invention is carried out on conventional commercial equipment, such as that shown and described in the U.S. Pat. No. 4,142,958, issued Mar. 6, 1979 to D. Wei and A. Louderback for a "METHOD FOR FABRICATING MULTI-LAYER OPTICAL FILMS" having a common assignee with this application, incorporated herein by reference and U.S. Pat. No. 4,793,908, issued Dec. 27, 1988 to G. Scott, C. Kohlenberger and D. Warren for a "MULTIPLE ION SOURCE METHOD AND APPARATUS FOR FABRICATING MULTILAYER OPTICAL FILMS", and assigned to Rockwell International Corporation, also incorporated herein by reference. The equipment in the high vacuum chamber, where polishing and deposition is to be accomplished, includes a conventional ellipsometer, two ion beam guns directable at substrates and targets, and an ultra high vacuum cryogenic pump. It should be noted that many of the parameters in the Scott et. al. reference are changed.

Conventional cleaning with an ion gun tends to produce rough substrates with surfaces having sub-microscopic defects on their surfaces characterized as pits and "sleeks".

However, it is possible to ion polish and coat substrates without removing them from the vacuum chamber until all processing is finished. (i.e.) Up to an estimated 100 coating layers having a thickness of ¼ wavelength of reflecting material have been deposited on the atomically uncontaminated polished substrate without breaking the chamber vacuum between the steps of polishing the substrates and depositing all layers.

Further, the polishing is effected at an oblique angle between the horizontal and the center line of the gun to the substrate in the range of 45–60 degrees. Moreover, non-contact surface flatness measurements down to ½–¾ angstrom are obtained for process control in-situ made optical elements. The substrates must be rotated during polishing. The polishing gun power is increased to about 25–50 mA with 600–950 Vdc being applied to the gun.

Further optical improvement is attained by slightly altering the oblique polishing angle as a function of light to lens angle for the intended application of the optics to be formed from the substrates. An apparatus and method for using a wobble stick for making micron adjustments to the tilt of a witness piece to align the ellipsometer reflected beam to the fixed ellipsometer detector is also disclosed.

DETAILED DESCRIPTION OF THE DRAWINGS

FIG. 6 is a side elevational view of the actual structure of a portion of FIG. 5;

FIG. 7 is a front elevational view of FIG. 6; FIG. 8 is an isometric view of a motion manipulator of the type employed herein;

DETAILED DESCRIPTION OF THE PREFERRED EMBODIMENT

Figure 1:
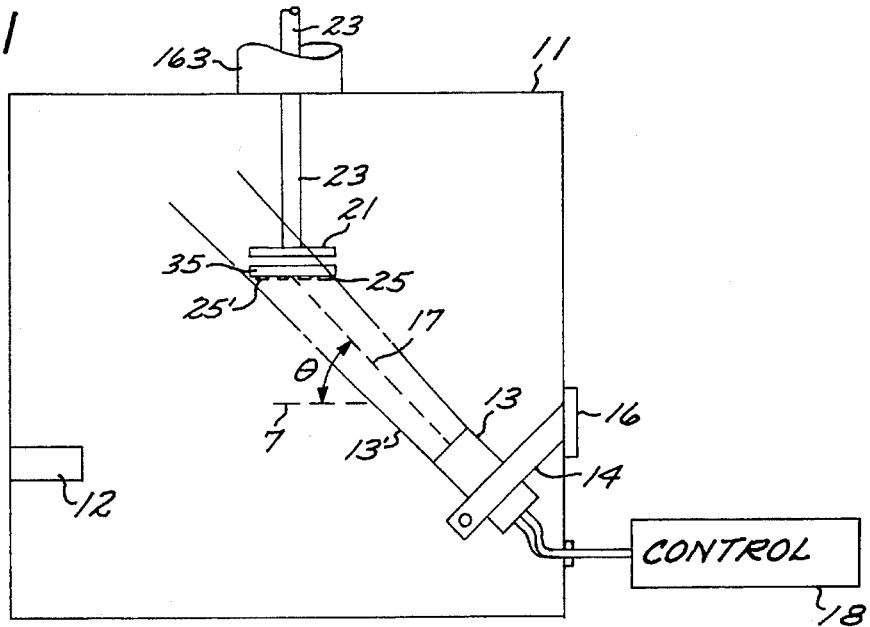
FIG. 1 is a schematic showing of a high vacuum chamber equipped with an ion gun to upgrade substrates to higher classes by polishing.

FIG. 1 shows a high vacuum chamber 11 equipped with an ion beam gun 13. The acute oblique angle θ is shown between a horizontal reference line 7 and the ion gun beam center line 17. The preferred polishing angle is between 45 and 60 degrees. The substrate carrier 21, which is rotatable via shaft 23 through a conventional vacuum seal 163. The beam 13' from gun 13 is large enough to encompass substrate holder 35 and substrate 25. The polishing ion beam gun 13 is typically a three centimeter diameter Kauffman type gun that provides excellent results, and is orientable through bolt 16 and bracket 14.

ION POLISHING PROCESS

In conventional fashion, the substrate 25 (or many substrates, held in a substrate carrier 35,) is loaded and shuttered and the chamber 11 is closed. A conventional roughing pump is started and a conventional cryogenic (cryo) pump takes over at crossover, down to about $10^{-8}$ torr.

Argon gas is turned on and supplied to the three centimeter polishing gun 13. The power to the three centimeter polishing gun 13 is turned on, and it is warmed up for about 5 minutes. A conventional neutralizer 12 is turned on. The ion beam 13' is then turned on to obtain polishing with neutral ions.

Figure 4:
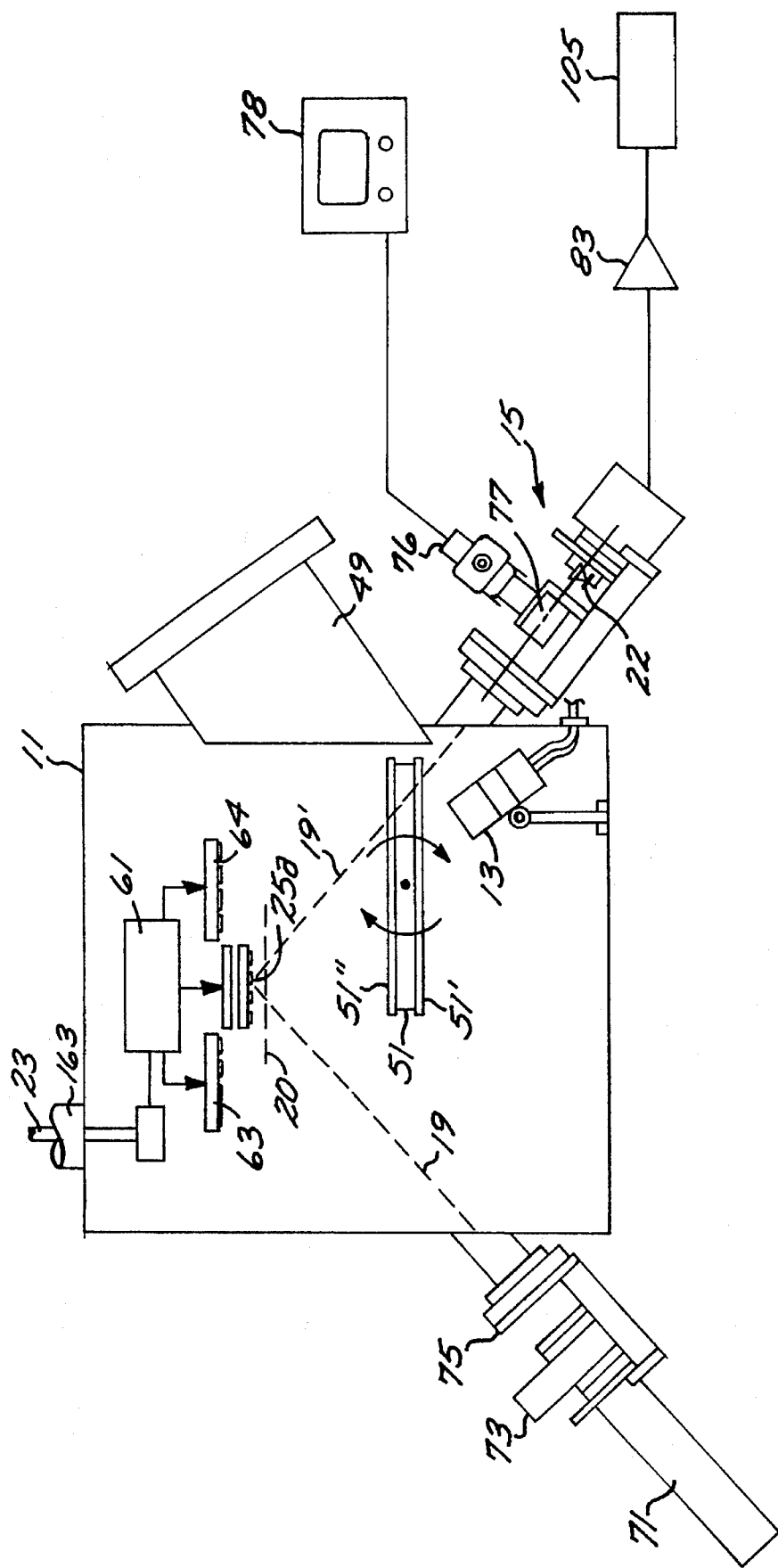
FIG. 4 is a schematic showing of a high vacuum chamber equipped for in-situ polishing and deposition.

Referring to FIG. 4, shaft 23 is rotate to drive planetary gear system 61. A conventional shutter 20 opens and exposes the substrate 25 to the ion beam 13 (FIG. 1).

Using previously gathered test run or historical data, developed from microscope checking for types of defects, as a guide, the conventional beam timer or control 18 (FIG. 1) is set for 5 to 30 minutes for bulk material removal to eliminate the microscopic scratches, sleeks and other defects. For the first two minutes, volatiles, stains and organic materials are removed.

The best method for measuring flatness is to use a TAPPING MODE ATOMIC FORCE MICROSCOPE, such as one available from Digital Research of Santa Barbara, Calif. which uses a sensor that vibrates at a very high frequency. The manufacturer claims that the instrument's sensor rides on a meniscus of air and does not destroy or damage the part being measured.

The polishing continues for the predetermined interval. If the substrates 25 are being polished to be upgraded only, i.e. those substrates that are being polished to be upgraded only without immediate or contemporaneous coating, then the argon gas for polishing ion gun 13 and the electrical power for ion gun 13 are shut off. The neutralizer and it's gas supply should also be turned off. The chamber is then opened. However, if the substrates 25 are being polished in preparation for subsequent coating, the chamber vacuum remains undisturbed and the ion gun 13 and neutralizer 12 remain.

Figure 2:
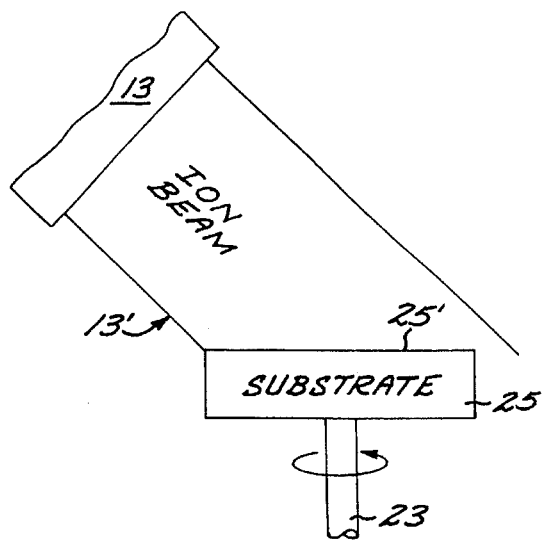
FIG. 2 shows polishing a substrate during rotation.
Figure 2A:
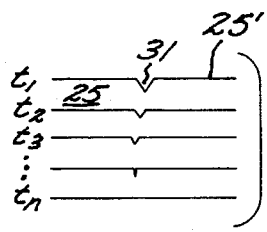
FIG. 2A shows, in cross section, the removal, of scratches by ion polishing with rotation, as a function of times t1, t2, . . . tn.

Referring to FIG. 2, in operation, ion beam 13' from ion gun 13 completely covers the substrate surface 25' of substrate 25 being polished. Note that rotation of the substrate 25 is necessary during the oblique angle removal of up to hundreds and even thousands of angstroms from substrate surface 25'. The preferred rotation speed is about 36 RPM. This is confirmed in FIG. 2A by removing scratch or sleek 31 through continuing surface removal as a function of times t1, t2, t3, . . . tn until the scratch 31 disappears.

Figure 3:
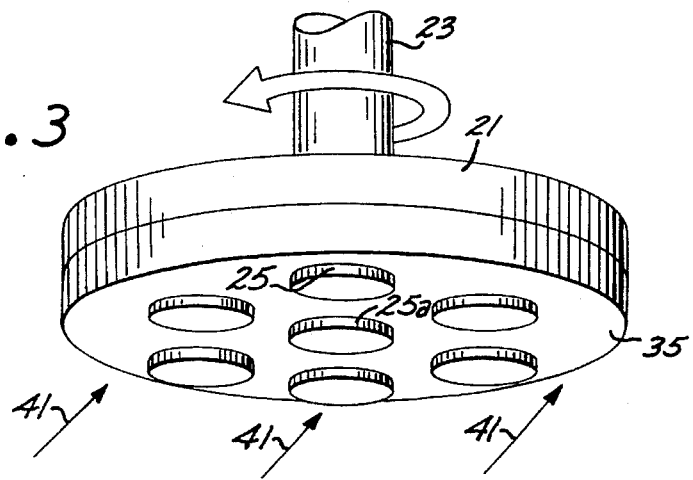
FIG. 3 shows polishing of a number of substrates during rotation.

In FIG. 3, up to seven substrates, 25 are carried in the substrate holder 35. Rotating platen, or substrate carrier 21 is affixed to shaft 23 in order that rotation is imparted to the substrates as the neutralized ions from the gun strike at the preferred oblique angle as illustrated by lines 41.

ELLIPSOMETER ALIGNMENT FOR THE COATING PROCESS

Ellipsometer 15 (FIG. 4) measures ellipticity (phase angle) of light reflected from the surface. Ellipsometer 15 analyzes the polarization of reflected light from the target surface. The ellipsometer provides an output measurement in degrees of delta and degrees of psi where delta is in the range of 0–360 degrees, and psi is measured from 0 to 90 degrees. The measurement numbers are obtained from the instrument. Delta repeats every 180 degrees and psi every 90 degrees.

As an example, assume that a mirror surface is to be coated for use with HeNe light at 0.63 micrometers. One of the coating materials to be used might be $Ta_2O_5$ tantalum pentoxide. $Ta_2O_5$ tantalum pentoxide has an index of approximately 2.12. Once the index of refraction is known, then the thickness of the coating for a ¼ wavelength coating would be obtained from a table located in the owner's manual provided by the manufacturer of the Ellipsometer, such as the Gaertner Scientific Corp., Chicago, Ill. The index of refraction of the selected substrate material must be known for insertion into the machine for the calculation.

For example, the index of refraction for silica is 1.457. This value would be inserted into the ellipsometer's register for use by the elipsometer's internal program. If the user were to be using glass from a company such as Schott Glass Technologies Inc. of Duryea, Pa., all of the necessary data for use with the ellipsometer would be available from the catalog of glass company. However, if another material was to be deposited, such as a layer of $TiO_2$ titanium dioxide, then the user could obtain a value for the theoretical index of refraction of the $TiO_2$ titanium dioxide film to be formed from a handbook source such as the American Institute of Physics Handbook, published by the McGraw Hill Book Co., published in 1982 or a later revision. When using a metal Ti (titanium) target, oxygen is introduced into the chamber to form the titanium dioxide.

The quality or flatness of the surface is not measured with the ellipsometer. The surface flatness or quality is measured with a profilometer, such as a profilometer by the Dektak Company that measures surface flatness in units of angstromsfor a given area measured in millimeters squared, (Angstroms/millimeters squared). Another profilometer that was used was the a model MKIII-01 from the Zygo Company of Laural Brook Road, Middlefield, Conn. The Zygo profilometer measures surface flatness in Angstroms.

The ellipsometer 15 measures the thickness of the coating or film in real time as the material is being deposited. In the arrangement of FIG. 4, the elipsometer is not in the chamber 11. The ellipsometer 15 monitors the light reflected from a witness piece 25a (shown in FIG. 3) specimen through a window in the chamber.

The parts are mechanically polished outside of the chamber to a finish that is better than two angstroms flatness for the whole surface area before the part is positioned in the chamber. The parts are loaded in the chamber and then the chamber is evacuated. As the polishing processing continues, the time to stop is determined empirically. The ablation rate of material for a predetermined ion current is known from past historical data. The time required is obtained from the data based on a depth obtained optically from the pre-polished parts before the chamber was closed. The chamber is then operated for the required time at the required current.

The profilometer is only used for flatness measurements on parts outside of the chamber. The measurement of flatness with a profilometer typically requires touching the surface of a substrate and that is destructive. The two guns are not used simultaneously.

During the process of being ground and polished, the blocked parts (encased in wax) are removed from the polishing machine. A sample lot of the parts are selected for measurement of their flatness. If the samples are of suitable quality for the optics application, the remainder are assumed to be acceptable. The acceptable parts are then deblocked, visually inspected under a dark field microscope for scratches and pits and a laser microscope for bulk scatter. No quantitative units of measurement are involved. The evaluation is qualitative.

The parts are then illuminated with a HeNe laser and the surface is explored for scatter sites and sleeks. All inspection steps are accomplished outside of the chamber before the parts are loaded into holders 63, 64.

The inventive step is cleaning the parts in the chamber for a time determined as a result of the evaluation of the surface quality that is made before the holders containing the substrates are placed in the chamber prior to ion polishing or ion coating.

Figure 5:
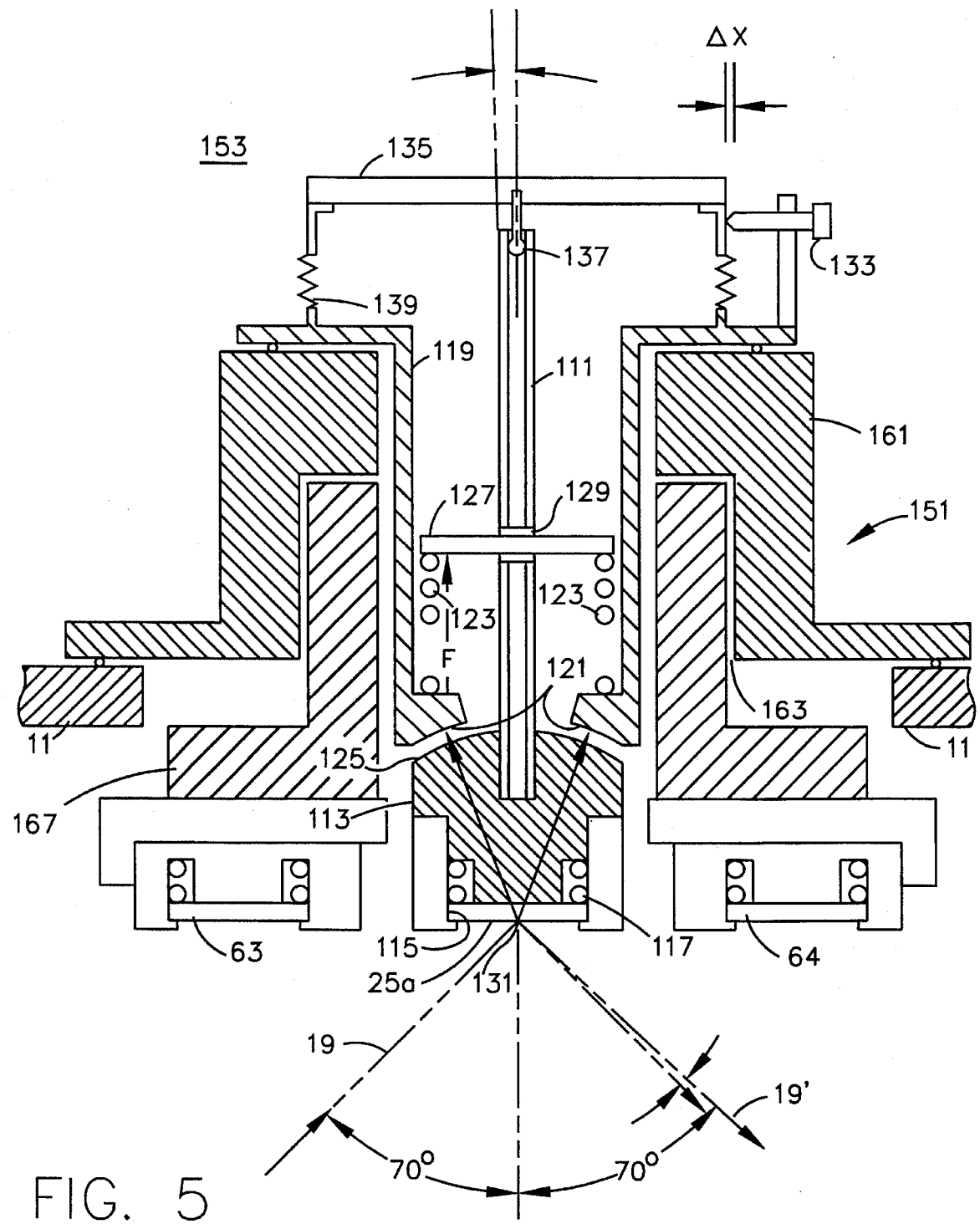
FIG. 5 is a structured schematic showing a wobble stick for a witness piece for aligning the ellipsometer while preserving the vacuum and providing both rotary motion and tilt motion into the chamber.
Figure 9:
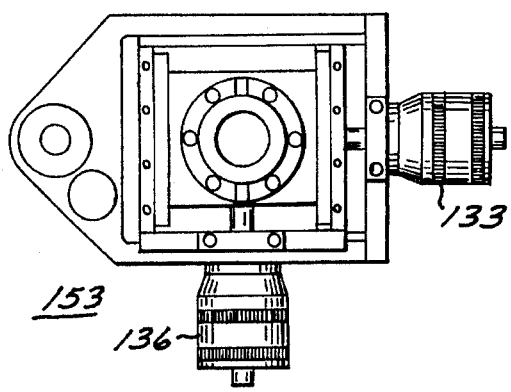
FIG. 9 is a plan view of FIG. 8.
Figure 10:
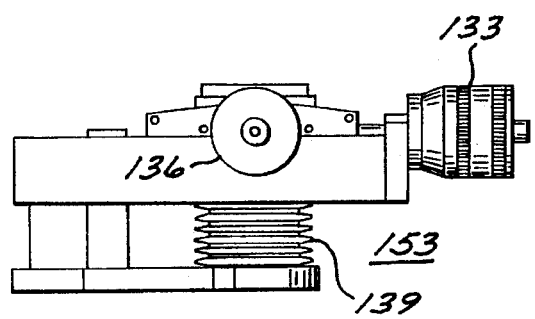
FIG. 10 is a side elevational view of FIG. 8.

As shown in FIG. 5, the ellipsometer polarized laser beam 19 is directed to and is then reflected and oriented from the focal point 131 of witness piece 25a precisely in order that the reflected beam will be aligned on the ellipsometer detector 22 (FIG. 4). The ellipsometer is rigidly secured to chamber 11. A shutter 20 is positioned to a closed position to protect the substrates 25 and witness piece 25a at all times except during ion polishing and ion coating. It should be realized that the ellipsometer 15 measures film thickness down into the subnanometer range.

For the ellipsometer to make the required measurement, the helium neon laser 71 supplies a light beam to polarizer 73 which changes the light orientation to linearly polarize light applied to one quarter wavelength compensator 75 to emerge as beam 19 directed at the center of witness piece 25a.

The witness piece 25a is uniquely suspended from wobble rod 111 (FIGS. 4, 5, 6 and 7) in order that it may be oriented in the X and Y direction (i.e., tilted) to direct reflected beam 19' onto the detector 22 after passing along the optical path through the center of analyzer 77 within ellipsometer 15. Once beam 19' is positioned on the detector 22, witness piece 25a remains stationary. Referring to FIG. 4, video camera 76 provides a video signal to a television monitor that shows the beam 19' on the detector 22 during the beam alignment phase. That image permits the operator to make the required adjustments in X and Y to locate the beam 19' directly on the center of detector 22.

The output of analyzer 77 is an elliptical beam that is focused on the detector 22. The ellipsometer processes a signal from the detector 22 to provide the value of film thickness deposited on witness piece 25a which receives the same target material as the movable planetary substrates 63, 64 etc. The information detected by detector 22 is amplified by amplifier 83 and recorded by recorder or computer 105.

Ellipsometer 15 makes its measurements during deposition so that when the proper film thickness has been obtained, target 51 is flipped over exposing its alternated material side to the ion beam from ion gun 49 so that a second index material is similarly deposited.

MICROPOSITIONER

Referring now to FIGS. 5–13 details of the novel micropositioner wobble rod construction and use will be discussed. FIG. 5 is a schematic view to show the operation of rod 111 and witness piece 25a, relative to substrates 63, 64 etc. which are revolving. The structure of FIG. 5 penetrates chamber 11 (via a door not shown) e.g., in the position of shaft 23 of FIG. 4. The shaft 111 is embedded in a substrate holder 113, at its lower end, which includes a recess 115 for the witness piece 25a. Spring 117 firmly holds the witness piece 25a against the recess shoulder.

Shaft or cylinder 119 is fixed against rotation and terminates in concave partial spherical surface 121. Spring 123 draws spherical surface 125 of holder 113 against spherical surfaces 121 due to lateral pin 127 in hole 129 in rod 111. It is important to note that the center of both spherical surfaces 121, 125 is focused at focus point 131 at the bottom center of witness piece 25a.

Micrometer 133 is operated to push cover 135 to the left, thereby moving rod 111 to the left due to cover ball 137 protruding into the top of hollow rod 111. For example, a movement of micrometer 133 causes shaft 111 to move via cover ball 137 a distance ΔX. This results in a rotation of holder 113 which results in a rotation of the substrate front surface, or more particularly, the focal point 131 without translation.

The process of aligning the reflected beam 19' on the detector 22 in ellipsometer 15 requires the following steps. The ellipsometer 15 is supplied with a video system comprising a video camera 76 and a monitor 78. The reflected beam 19' and the detector target within the ellipsometer are imaged on the monitor. The spot produced by the reflected beam 19' is superimposed on the center of the detector target using the X and Y micrometer adjustments 133, 136 (FIG. 8). The aneroid bellows 139 maintains the chamber vacuum while permitting the alignment adjustments.

The invention accommodates vacuum sealing, stationary shaft chamber penetration and rotational shaft chamber penetration while enabling micron adjustment of the tilt of the witness piece 25a, and consequently, alignment of the ellipsometer beam without breaking the vacuum.

A rotary planetary drive 151 is obtained from Ferrofluidics Corp., 40 Simon Street, Nashua, N.H., 03061, and the top is removed so a motion manipulator 153 such as type PSM-2 from MDC Vacuum Products Corp., 23842 Cabot Boulevard, Hayward, Calif. 94545-1651 can be affixed to the top thereof to receive the bellows 139 in vacuum tight sealing so the X and Y manipulators can push cover 135. In FIG. 5, the exterior 161 of the rotary seal 151 is sealed by magnetized liquid at 163 and the adjacent passageways. The rotary member 167 carries the substrates 63, 64, etc. These two units are affixed together by adding mounting plates 157 and 159, as shown in FIG. 7.

Figure 11:
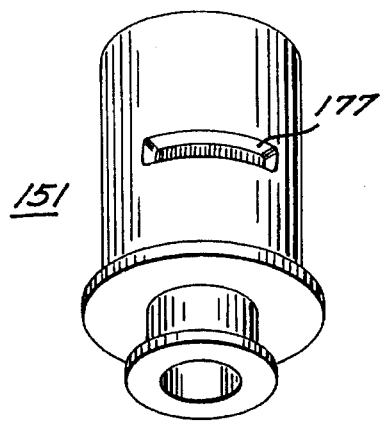
FIG. 11 is a perspective view of the rotary planetary drive feedthrough.
Figure 12:
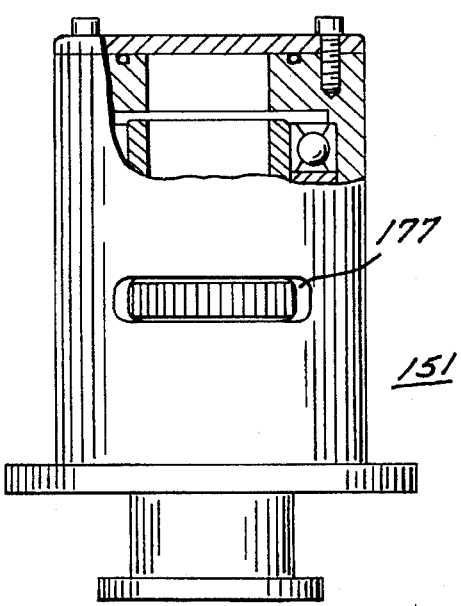
FIG. 12 is a side elevational view of FIG. 11, partly broken away.
Figure 13:
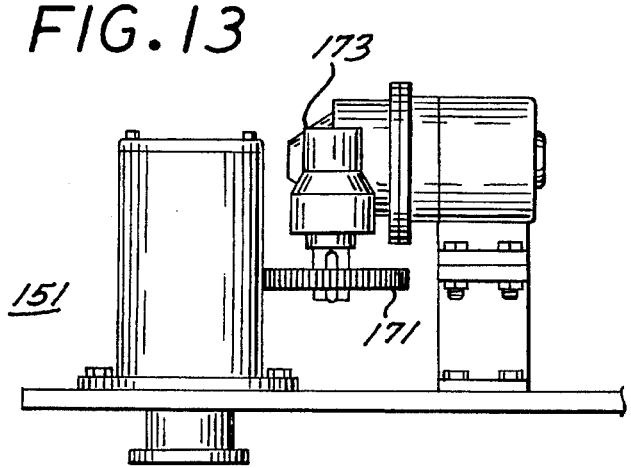
FIG. 13 is a view of the drive for FIG. 12.

FIG. 7 best shows the sealing of the wobble rod structure. A Del Seal is used between bellows 139 and plate 157. O-Rings 118 and 120 seal plates 157 and 159 and rotary drive 151. O-Rings 124 seals rotary planetary drive 151 to chamber 11. The drive is best seen in FIGS. 7, 11 and 13. The driving gear 171 imparts drive from motor 173 (FIG. 13) to rotary member 167 (FIG. 5) via slot 177 to drive substrates 63, 64 etc. The drive of FIG. 13 shows the backside of the structure to be compatible with structure of FIG. 7.

COATING PROCESS

In FIG. 4, a second ion gun 49 e.g. a 15 cm diameter gun, is installed in chamber 11. Target 51 is provided to receive neutral ions from the second gun 49, used following conclusion of the polishing, which occurs when the polishing gun is turned off and the 'shutter closed. Target 51 and single axis gearing 61 are in chamber 11 from the start of the polishing process in order that the vacuum chamber need not be opened allowing contaminants to enter It is possible to deposit layers on multiple substrates, such as 63 and 64 and others not visible in FIG. 4.

Preparatory to beginning the coating process, the argon for polishing gun 13 is shut off and the neutralizer and it's gas supply remain on.

The power supply is turned on to the large gun 49 and its argon is turned on with warming proceeding for about 20 minutes.

The targets 51 are now pre-sputtered, which removes away water vapor by adsorption and absorption. Approximately 2000 angstroms of surface material may be removed from the targets in this target cleaning step, pre-sputtering the target.

The ellipsometer 15 is set for the desired design thickness and index of target material to be coated, i.e., the shutter is opened and high index material is deposited on the substrates first. This first material may be tantalum pentoxide, titanium dioxide or other known materials until the thickness set on the ellipsometer 15 is reached. The invention operates with single, double or multiple layers.

The shutter is then closed, and the ellipsometer is set for the second layer, which may be low index silicon dioxide. The target 51 is rotated to expose the selected material to the beam of gun 49. This procedure is followed for up to 100 layers or so for high reflector mirrors and 2 to 3 layers for anti-reflective narrow "V" coating.

Then the shutter is closed and the gun power supplies are turned off. The system is vented and all parts are removed.

Now the in-situ advantages are recognized because premium laser mirrors or other highest quality parts are produced in the contaminant free chamber.

It should be apparent now that the invention is in the concepts or discoveries and parameters which make them possible and in the wobble stick beam alignment method and apparatus. First, the polishing step extended beyond the prior art cleaning step to remove up to thousands of angstroms of surface to obtain ½ to ¾ angstrom flatness, and requiring rotation of the substrate and directing the ion beam at an oblique angle of preferably 45 to 60 degrees. The gun power is increased over the art to about 25 mA at 600–950 Vdc, using control 18 (FIG. 1).

After the process of polishing the substrates, the step of confining the substrates in the unopened chamber during both the polishing and custom coating is practiced to prevent contamination and to produce premium optics, using an ellipsometer to measure attained thickness and index of refraction of the film, films or coating without breaking the vacuum. This requires target material, the substrates, and a second ion beam gun initially in the chamber. Further optics improvement is obtained by altering the oblique polishing angle as a function of incident light to lens angle in the intended application of the optics to be formed from the substrates.

It should be understood that, although the process of first polishing substrates and then coating the same substrates in-situ has been explained and emphasized, in detail, it should also be clear that the apparatus and coating process thus far explained could be used to coat pre-polished single or multiple substrates or faraday rotators to laser gyro quality standards.

It should be apparent that the principles of the invention may be incorporated into other structures and what is described herein is only the preferred or best mode. The scope of this patent should therefore be interpreted in light of the appended claims.

What is claimed is:

1. The method of polishing a surface of a substrate to an improved surface flatness, comprising the steps of:
    establishing a vacuum equal to or exceeding $10^{-8}$ torr in a vacuum chamber;
    mounting the substrate for rotation in the chamber;
    directing an ion beam from a gun at the rotating substrate surface at an oblique angle of approximately 45 to 60 degrees between the substrate and the center line of the gun to the substrate; and,
    maintaining the ion beam until 200 or more angstroms of surface have been removed from the substrate to achieve a surface smoothness of ½ to ¾ angstrom.

2. The method of claim 1, wherein:
    using a previously polished substrate as said substrate to be polished in the chamber to an improved surface smoothness; and,
    producing the vacuum by a contamination free cryogenic pump integral with the chamber.

3. The method of claim 2 wherein:
    rotating the substrate about 36 revolutions per minute.

4. The method of claim 1, wherein,
    producing the ion beam by a 3 centimeter ion beam gun; and,
    spacing the gun approximately 20 centimeters from the rotating substrate surface to be polished.

5. The method of claim 1 wherein:
    said ion gun is operated at a current of 25 to 50 milliamperes at 600–950 volts DC.

6. The method of claim 1 for both polishing and depositing coatings on substrates comprising the further steps of:
    depositing said coatings in-situ immediately following said polishing without breaking the vacuum.

7. The method of claim 6 wherein:
    using a second ion gun integral with said chamber to effect the deposition.

8. The method of polishing and in-situ coating a substrate in a vacuum chamber comprising the steps of:
    using an ion gun beam to polish the substrate to a flatness of ½ to ¾ angstrom by directing the ion gun beam at the substrate from an oblique angle of 45–60 degrees relative to the substrate while the substrate is being rotated; and
    using a second ion gun to deposit the coating in-situ without breaking the vacuum to achieve super reflectivity in the coating.

9. The method of claim 8 wherein:
    using a previously polished substrate as said substrate in the chamber to be polished to an improved surface smoothness;
    determining the oblique angle that the substrate will receive light in its subsequent commercial application; and
    accomplishing said polishing at approximately the same oblique angle that the substrate will receive light in its commercial application.

10. The method of polishing and coating substrates using a vacuum gas chamber to produce anti-reflection coatings, comprising the steps of:
    using a first ion gun integral with the chamber using a first gas to polish the substrates to ½ to ¾ angstrom flatness by directing the ion beam at the rotating substrate from an oblique angle of 45 to 60 degrees relative to the substrates for a length of time necessary to obtain said degree of flatness determined by timing the polishing based on prior known polishing times for the same materials;
    using a second ion gun having a second gas to deposit said coating to form the anti-reflection coating; and,
    using a cryogenic pump to maintain said chamber free of contaminants and at about $10^{-8}$ torr.

11. The method of claim 10 further comprising the steps of:
    using an ellipsometer to measure the thickness of each coating while the coating is being deposited.

12. The method of claim 11, further comprising the step of:
    using a witness piece and an ellipsometer to measure the thickness of film deposited of a witness piece in order to estimate the thickness of similar film material deposited on substrates.

13. The method of claim 12 further comprising:
    operating the first ion gun at 25–50 milliamperes at 600–950 volts D.C.;
    spacing the first ion gun approximately 20 centimeters from the substrate surface;
    rotating the substrate at approximately 36 revolutions per minute; and,
    directing an ellipsometer beam at the witness piece at about 70 degrees from the vertical and reflecting the beam at the same angle from the witness piece relative to the vertical to center the beam on the detector.

14. An apparatus for polishing substrate surfaces to an improved surface flatness, comprising in combination:
    a vacuum chamber having an ultra high vacuum equal to or exceeding $10^{-8}$ torr;
    an ion beam gun;
    means mounting a substrate having a previously polished surface in the chamber;
    means for directing the ion beam from said gun at the substrate polished surface at an oblique angle of 45–60 degrees between the substrate and the centerline of the gun to the substrate;
    means for rotating said substrate; and
    means for maintaining the ion beam until 200 or more angstroms of surface have been removed from the substrate to achieve a surface flatness of ½ to ¾ angstrom.

15. The apparatus of claim 14 further comprising: a cryogenic pump integral with the chamber for producing the ultra high vacuum.

16. The apparatus of claim 14, further comprising:
    means for spacing the gun approximately 20 cm from the substrate to be polished; and,
    said ion beam gun being a three centimeter gun.

17. The apparatus of claim 14 further comprising:
    means for rotating the substrate at about 36 revolutions/minute.

18. The apparatus of claim 14 further comprising: means for operating said gun at a current of 25–50 milliamperes at 600–900 volts dc.

19. The apparatus of claim 14 for both polishing and depositing coatings on substrates further comprising:
    means for in-situ coating said substrates immediately following said polishing without breaking the vacuum.

20. The apparatus of claim 19 wherein:
    said means for coating comprises a second ion gun integral with said chamber to effect the deposition.

21. Apparatus for further polishing and in-situ coating a previously polished substrate in a vacuum chamber comprising in combination:

means for mounting the previously polished substrate for rotation in the chamber;

an ion gun having a beam to polish the substrate to a flatness of ½ to ¾ angstrom;

means for directing the ion gun beam at the substrate from an oblique angle of 45–60 degrees relative to the horizontal;

means for rotating the substrate while in the beam; and, a second ion gun to deposit the coating in-situ without breaking the vacuum to achieve improved reflectivity in the coating.

22. The apparatus of claim 21 wherein the oblique angle that the substrate will receive light in its subsequent commercial application is determined, further comprising:

means for polishing the substrate at approximately the same oblique angle that the substrate will receive light in its commercial application.

23. Apparatus for further polishing and coating previously polished substrates using a vacuum gas chamber to produce anti-reflection coatings, comprising in combination:

means for rotating the substrates in the chamber;

a first ion gun integral with the chamber in a first gas to polish the substrates to ½ to ¾ angstrom flatness by directing the ion beam at the rotating substrate from an oblique angle of approximately 45 to 60 degrees relative to the substrate for an amount of time necessary to obtain said degree of flatness determined by timing the polishing based on prior known polishing times for the same materials;

a second gas and a second ion gun to deposit said coating, layer by layer, to form the anti-reflection coating; and, a cryogenic pump to maintain said chamber free of contaminants and at about $10^{-8}$ torr.

24. The apparatus of claim 23 comprising in combination:

an ellipsometer to measure the thickness of each coating while the coating is being deposited.

25. The apparatus of claim 24, comprising in combination:

a witness piece and an ellipsometer to measure the thickness of film deposited on the witness piece in order to estimate the thickness of similar film material deposited on substrates.

26. The apparatus of claim 25, comprising in combination:

said ellipsometer having a source of light and a detector for reflected light;

said ellipsometer reflecting a polarized beam of light off of the witness piece onto the receiver; and, a wobble stick to tilt the witness piece in order to line up the ellipsometer beam reflected from the witness piece to the detector of the ellipsometer.

* * * * *